United States Patent
Schell et al.

(10) Patent No.: US 6,734,724 B1
(45) Date of Patent: May 11, 2004

(54) POWER CONTROL AND MODULATION OF SWITCHED-MODE POWER AMPLIFIERS WITH ONE OR MORE STAGES

(75) Inventors: Stephan V. Schell, San Francisco, CA (US); Wendell B. Sander, Los Gatos, CA (US); Ronald A. Meck, Soquel, CA (US); Robert J. Bayruns, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/684,497

(22) Filed: Oct. 6, 2000

(51) Int. Cl.[7] .................. H03F 3/38; H03F 21/00; H03F 3/217; H03F 3/04; H03G 3/30
(52) U.S. Cl. .............. 330/10; 330/127; 330/207 A; 330/251; 330/297
(58) Field of Search ............... 330/10, 127, 207 A, 330/251, 297

(56) References Cited

U.S. PATENT DOCUMENTS

| | | | |
|---|---|---|---|
| 3,900,823 A | | 8/1975 | Sokal et al. |
| 4,831,334 A | | 5/1989 | Hudspeth et al. ............... 3/38 |
| 5,128,629 A | * | 7/1992 | Trinh ......................... 330/129 |
| 5,251,331 A | | 10/1993 | Schwent et al. ................ 1/4 |
| 5,675,288 A | * | 10/1997 | Peyrotte et al. ............. 330/136 |
| 5,892,404 A | * | 4/1999 | Tang ......................... 330/202 |
| 5,986,503 A | * | 11/1999 | Ichikawa .................... 330/277 |
| 6,104,248 A | * | 8/2000 | Carver ....................... 330/10 |
| 6,118,989 A | * | 9/2000 | Abe et al. .................. 330/151 |
| 6,175,279 B1 | * | 1/2001 | Ciccarelli et al. ............ 330/296 |
| 6,256,482 B1 | | 7/2001 | Raab |
| 6,295,442 B1 | | 9/2001 | Camp, Jr. et al. |

FOREIGN PATENT DOCUMENTS

| | | | |
|---|---|---|---|
| EP | 11318084 | 11/1999 | ............... 7/48 |
| FR | 2768574 | 3/1999 | |
| WO | WO 00/48307 | 8/2000 | ............... 1/30 |

OTHER PUBLICATIONS

Chiba et al., Linearized Saturation Amplifier with Bidirectional Control for Digital Mobile Radio, NTT Radio Communication System Laboratories, 1990 IEEE.

* cited by examiner

*Primary Examiner*—Patricia Nguyen
(74) *Attorney, Agent, or Firm*—Thelen Reid & Priest LLP

(57) ABSTRACT

This invention controls and modulates switched-mode power amplifiers to enable the production of signals that include amplitude modulation (and possibly, but not necessarily, phase modulation), the average power of which may be controlled over a potentially wide range.

24 Claims, 8 Drawing Sheets

POWER CONTROL AND MODULATION OF SWITCHED-MODE POWER AMPLIFIERS WITH ONE OR MORE STAGES

BACKGROUND

1. Field of the Invention

The present invention relates to power amplifiers, particularly switched-mode power amplifiers.

2. Description of Related Art

Switched-mode power amplifiers have demonstrated the capability of producing, with high power-added efficiency (PAE), phase-modulated signals that have very high signal quality—i.e., low root-mean-square (RMS) phase error relative to an ideal signal and little or no degradation in power spectral density (PSD). These power amplifiers have also been demonstrated to be highly tolerant of temperature variation, and are believed to be highly tolerant to fabrication-process variation, making them attractive for high-volume applications such as consumer electronics. Such power amplifiers include a switch connected to a resonant network; the output of the resonant network is connected in turn to a load (e.g., the antenna in a radio transmitter).

An early switched-mode amplifier is described in U.S. Pat. No. 3,900,823 to Sokal et al., incorporated herein by reference. Sokal et al. describes the problem (created by unavoidable feedthrough from amplifier input to amplifier output) of power control at low power levels and proposes solving the problem by controlling RF input drive magnitude to a final amplifier stage. In particular, the input drive magnitude of the final stage is controlled by using negative feedback techniques to control the DC power supply of one or more stages preceding the final stage. Various other known techniques use variation of amplifier power supply for linearization as described, for example, in the following patents, incorporated herein by reference: U.S. Pat. Nos. 5,091,919; 5,142,240, and 5,745,526.

Another type of switched mode amplifier, that does not require the use of negative feedback as in Sokal, is described in U.S. patent application Ser. Nos. 09/247,095 and 09/247,097 of the present assignee, entitled HIGH-EFFICIENCY MODULATING RF AMPLIFIER and HIGH-EFFICIENCY AMPLIFIER OUTPUT LEVEL AND BURST CONTROL, respectively, filed Feb. 9, 1999 and U.S. patent application Ser. No. 09/637,269, entitled HIGH-EFFICIENCY MODULATING RF AMPLIFIER, filed Aug. 10, 2000, all incorporated herein by reference. In the latter switched-mode power amplifiers, the average power is determined by two signals: the switch supply signal and the switch control signal. The switch supply signal is the DC voltage available on one side of the switch; as this voltage increases, the peak voltage of the oscillatory signals developed within the resonant network and subsequently delivered to the load also increases. The switch control signal is typically a phase-modulated signal that controls the switch (i.e., determines whether the switch is on or off). This switch control signal should be strong enough to toggle the switch on and off but should not be excessively strong: unlike a linear amplifier in which the strength of the output signal is determined by the strength of the input signal, in a switched-mode power amplifier, if the switch control signal is too strong, the excess signal merely leaks through the switch and into the resonant network (i.e., feedthrough). When this occurs, a version of the switch control signal that is out-of-phase with respect to the desired signal adds to the desired signal within the resonant network, altering both the phase and the amplitude of the output signal in an undesirable way.

French Patent 2,768,574 also describes a switched-mode power amplifier arrangement. Referring to FIG. 1, in this arrangement, the power amplifier circuit comprises a DC-to-DC converter 20 and a power amplifier 30. The DC-to-DC converter 20 includes a pulse-width modulator 22, a commutator/rectifier 24 and a filter 26.

The pulse-width modulator 22 is coupled to receive a DC-to-DC command input signal from a signal input terminal 21, and is arranged to apply a pulse-width-modulated signal to the commutator/rectifier 24. The commutator/rectifier 24 is coupled to receive a DC-to-DC power supply input signal from a signal input terminal 25, and is also coupled to apply a switched signal to filter 26. The filter 26 in turn applies a filtered switched signal 28 in common to multiple stages of the power amplifier 30.

A circuit of the foregoing type is substantially limited by the frequency of the pulse-width modulator. In addition, common control of multiple power amplifier stages in the manner described may prove disadvantageous as described more fully hereinafter.

It is desirable to achieve more precise control of switched-mode-generated RF signals, including amplitude-modulated signals, such that the aforementioned benefits of switched-mode power amplifiers may be more fully realized.

SUMMARY OF THE INVENTION

This invention controls and modulates switched-mode power amplifiers to enable the production of signals that include amplitude modulation (and possibly, but not necessarily, phase modulation), the average power of which may be controlled over a potentially wide range.

In order to produce amplitude-modulated signals, the DC switch supply voltage is replaced by a time-varying switch supply signal that is related to the desired amplitude modulation. This switch supply signal can be either the desired amplitude modulation signal itself or a pre-distorted version thereof, where the pre-distortion is such that the output signal has the desired amplitude modulation. In the latter case, the pre-distortion corrects for amplitude non-linearity (so-called AM/AM distortion) in the switch and/or the resonant network.

The foregoing modification alone, however, may be insufficient to provide as much dynamic range in the output signal as may be desired. Also, the modification may not be sufficient to maintain dynamic range in the amplitude modulation while adjusting the average power of the output signal. Both of these problems are caused by the undesirable leakage signal described previously; its contribution to the output is largely independent of the level of the switch supply signal. That is, the switch supply signal may be reduced to zero volts (the minimum possible amplitude), yet the output signal will still be at a relatively high level; below some point, the amplitude modulation imparted through the switch supply signal is manifest less and less in the output signal.

Similarly, the severity of amplitude-dependent phase shift (so-called AM/PM distortion) increases as the switch supply signal decreases. This effect arises because the leakage of the switch control signal is out of phase relative to the desired signal. As the switch supply signal decreases, the desired signal decreases as well, whereas the leakage signal does not; since these two signals are out of phase, the phase of their sum is increasingly dominated by the phase of the leakage signal. This invention, in one aspect thereof, modifies the switched-mode power amplifier by adjusting the amplitude of the switch control signal to reduce the undesirable leakage effect. As a result, it becomes possible to produce output signals having average power anywhere within a wide range, or to greatly increase the dynamic range over which amplitude modulation may be produced at a given average power level, or both.

BRIEF DESCRIPTION OF THE DRAWING FIGURES

The present invention may be further understood from the following description in conjunction with the appended drawing figures. In the figures.

DETAILED DESCRIPTION OF THE PREFERRED EMBODIMENTS

Figure 1:
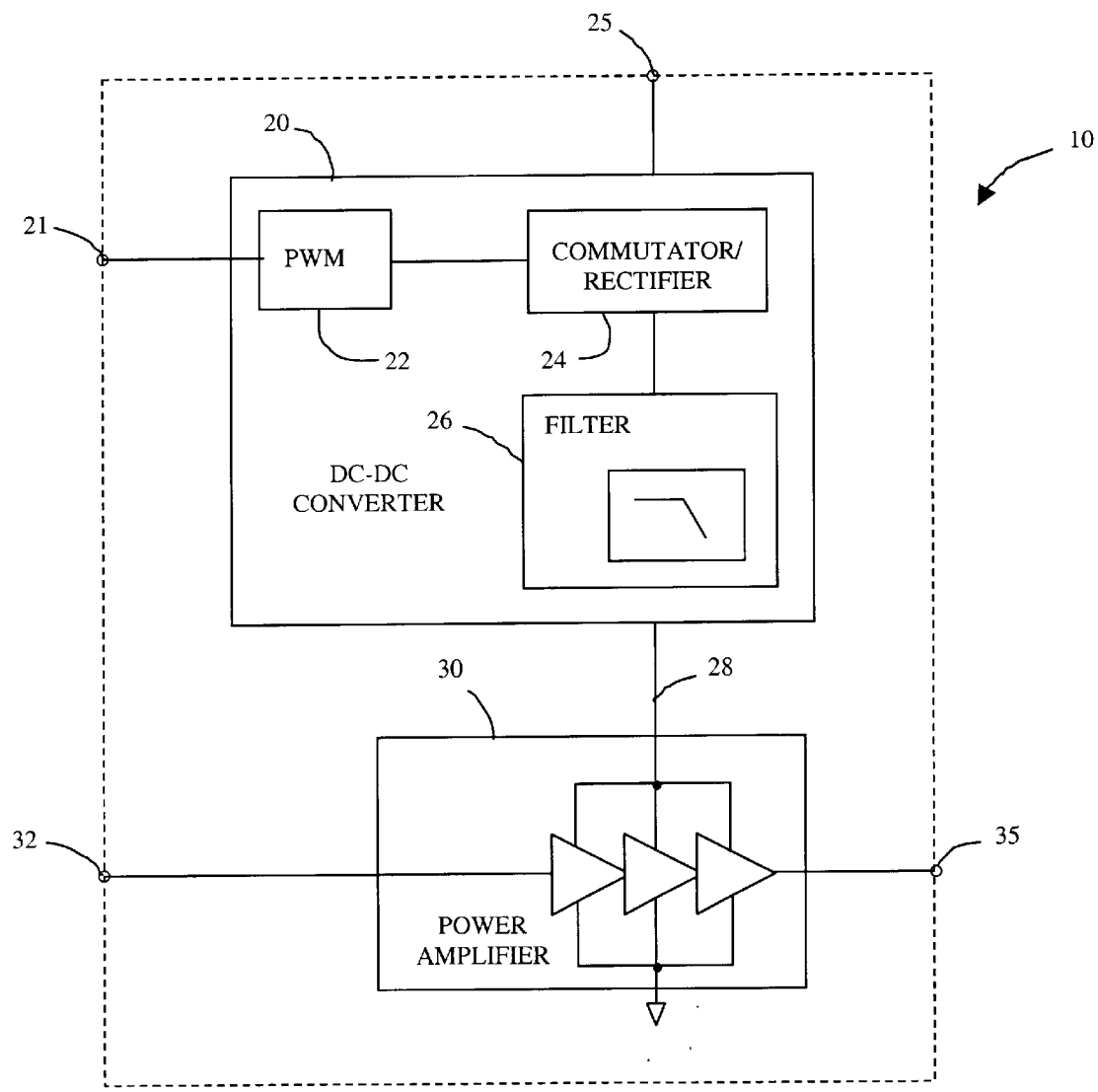
FIG. 1 is a block diagram of a known switched-mode power amplifier in a variable power supply voltage is applied in common to multiple stages.
Figure 2:
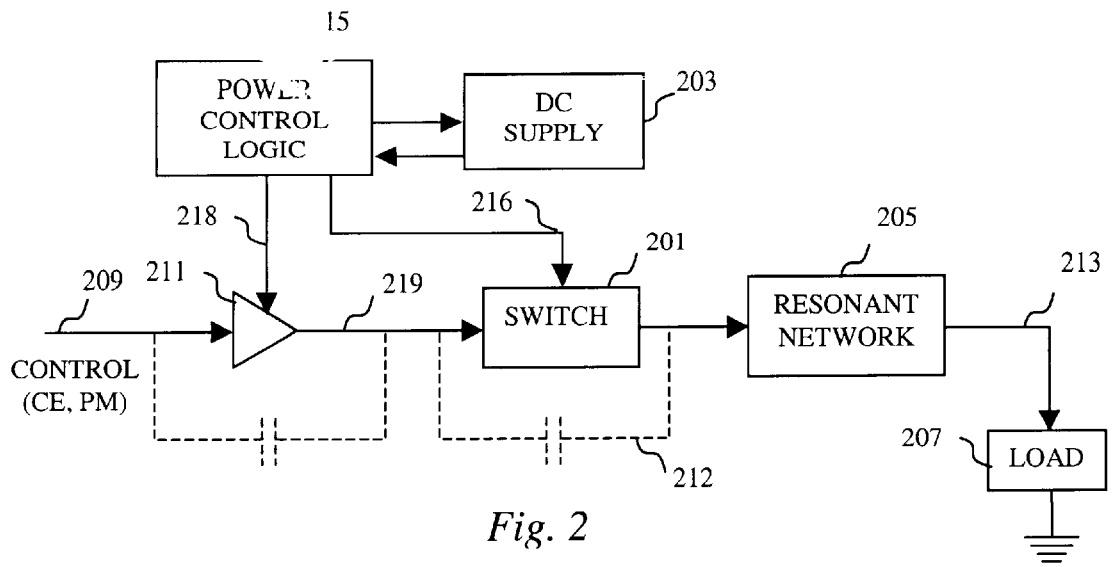
FIG. 2 is a block diagram of a switched-mode power amplifier without amplitude modulation capability.

Referring now to FIG. 2, a block diagram is shown of a switched-mode power amplifier. A switch 201 is coupled to a resonant network 205 and to power control logic 215, which is coupled in turn to a DC supply 203. The resonant network is coupled to a load 207. Control of the switch 201 is accomplished using a control signal 209, applied to an amplifier 211. The amplifier 211 produces a switch control signal 219, which is applied to the switch 201. As the switch 201 is opened and closed responsive to the control signal 209, the resonant network 205 shapes the switch voltage to produce a desired output signal 213.

In the amplifier of FIG. 2, the signals 209 and 219 are constant amplitude (CA) signals (i.e., oscillatory signals having a constant peak amplitude) that may be phase-modulated. The amplitude of the switch control signal 219 is set by the power control logic 215. The power control logic 215 also controls a DC supply voltage 216 produced by the DC supply 203 and supplied to the switch 201. As the power control logic 215 causes the DC supply voltage 216 to increase, the peak voltage of the oscillatory signals developed within the resonant network 205 and subsequently delivered to the load 207 also increases. Similarly, as the power control logic 215 causes the DC supply voltage 216 to decrease, the peak voltage of the oscillatory signals developed within the resonant network 205 and subsequently delivered to the load 207 also decreases.

Further details of the amplifier chain of FIG. 2 in accordance with an exemplary embodiment of the invention are described in the foregoing copending U.S. patent application. In addition, a bias control arrangement may be used to achieve optimal bias of the switch 201 under various conditions as described more fully in U.S. Pat. No. 6,323,731, filed on even data herewith and incorporated by reference.

In accordance with one aspect of the invention, a signal 218 is used to control the amplitude of the switch control signal 219 in a coordinated manner with control of the DC supply voltage 216, thereby avoiding excess leakage of the switch control signal 219 through the switch 201 and into the resonant network 205.

Figure 3:
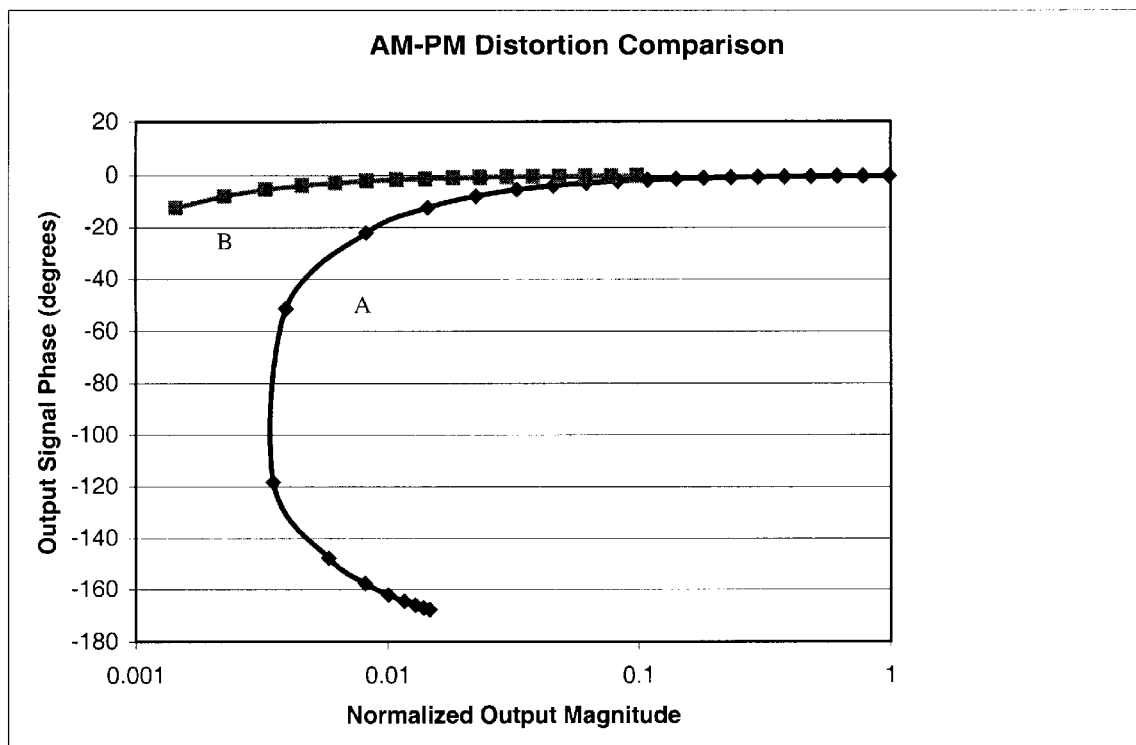
FIG. 3 is a diagram comparing AM/PM distortion in a switched mode power amplifier without a countermeasure of the invention and with a countermeasure of the invention.

More particularly, in any physical embodiment, a stray (unintended) capacitance 212 around the switch 201 is unavoidably present. This stray capacitance provides a leakage path for the switch control signal 219 to leak into the resonant network 205, where it mixes with the desired switch output signal. Since the switch control signal 219 is out-of-phase with the desired switch output signal, a large phase shift will occur at the switch output when the desired output signal magnitude is near to or smaller than that of the leakage signal. This effect is shown in FIG. 3, which depicts output phase and output magnitude as parametric functions of desired magnitude (i.e., as desired magnitude decreases, the curves of FIG. 3 are traced out in the counter-clockwise direction). In the illustrated case, signal leakage is assumed to be 35 dB below the maximum output signal (1.7%), at a relative phase shift of −170 degrees. If the switch control signal is not reduced (line A), then the amplifier output signal suffers severe AM-PM (and AM-AM) distortion when the desired output magnitude is less than 10% of the peak output magnitude.

This effect may be counteracted, for lower amplitude output signals (e.g., less than 10% of the peak output magnitude), by correspondingly reducing the switch control signal (e.g., to 10% of its original value). As FIG. 3 shows, this measure essentially removes the AM-PM and AM-AM distortion from the desired output signal (line B). In principle, this technique can be extended to arbitrarily low desired output signal magnitudes.

Figure 4:
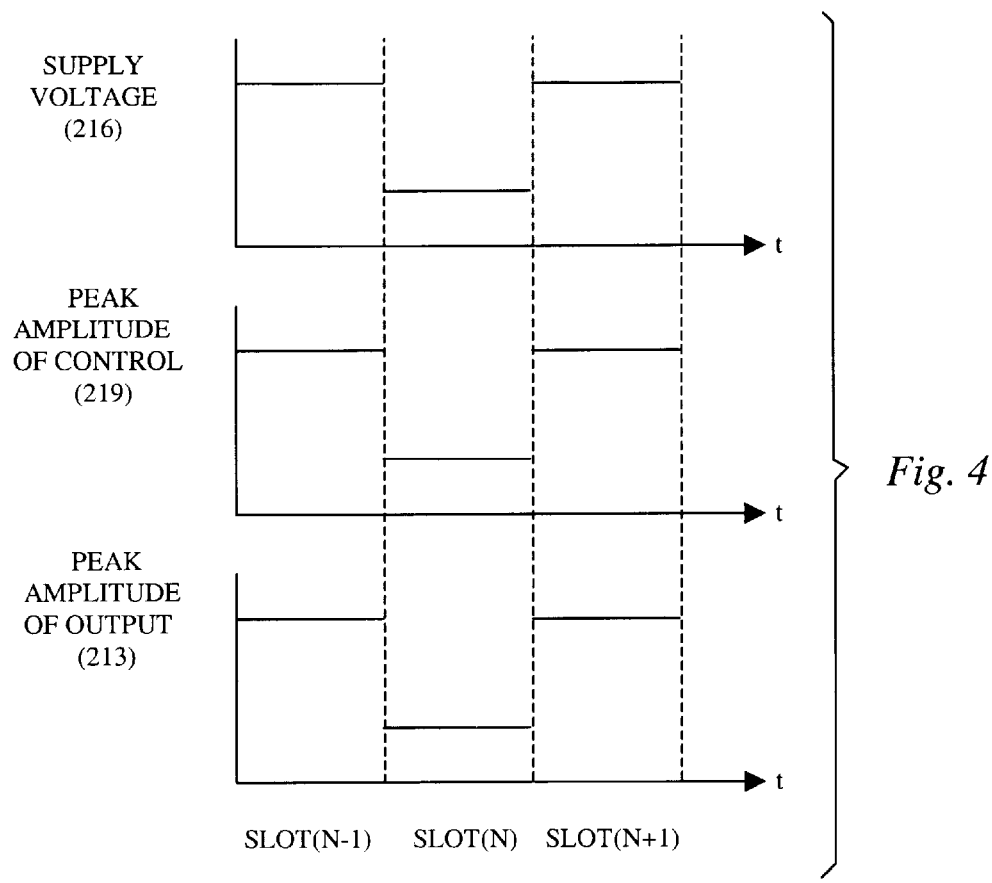
FIG. 4 is a waveform diagram of waveforms in the circuit of FIG. 2.

For illustration purposes, consider the need to produce a constant-amplitude RF signal in a time-slotted network, in which the output power may vary from slot to slot. In the amplifier of FIG. 2, this manner of operation may be achieved by holding the supply voltage 216 constant during a given time slot, and by holding the peak amplitude of the control signal constant during the time slot as illustrated in FIG. 4. As a result, the peak amplitude of the output signal 213 is constant during a given time slot. Note that when the supply voltage 216 is is at a low level, the control signal 219 is also at a correspondingly low level (e.g., time slot (N)). In this manner, the low-distortion characteristic of line B of FIG. 3 is achieved.

Figure 5:
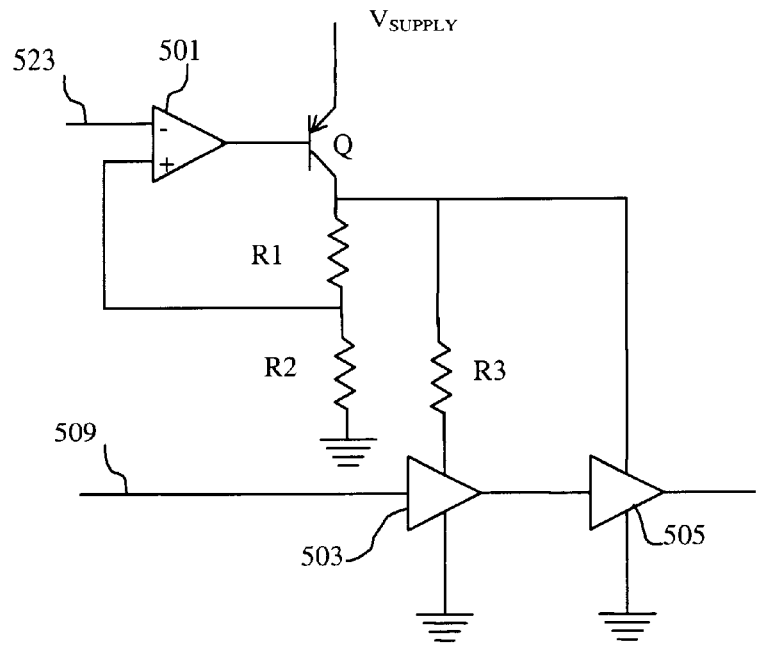
FIG. 5 is one possible circuit that may be used to control the application of power to one or more power amplifier stages.
Figure 6:
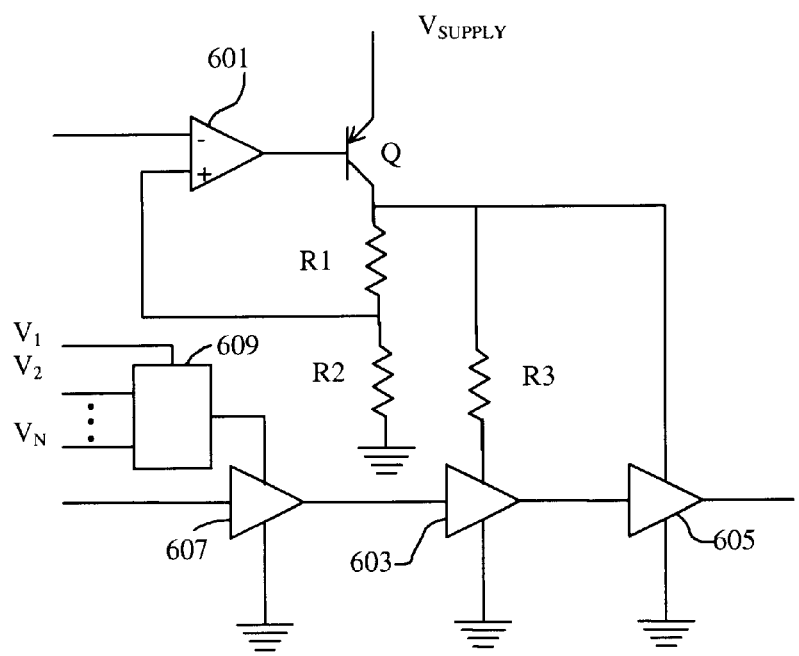
FIG. 6 is another possible circuit that may be used to control the application of power to one or more power amplifier stages.
Figure 7:
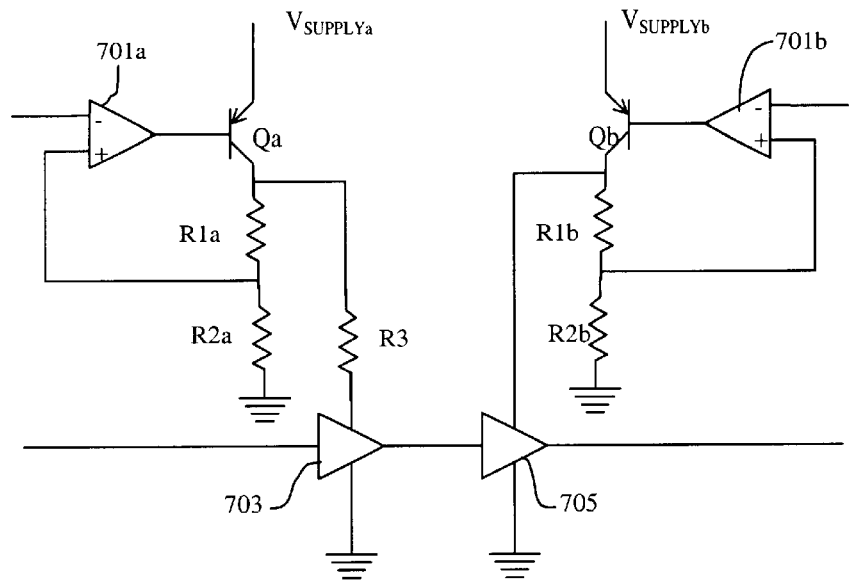
FIG. 7 is still another possible circuit that may be used to control the application of power to one or more power amplifier stages.

Various specific circuits that may be used within the power control logic 215 of FIG. 2 to control the application of power to the amplifier stages are shown in FIG. 5, FIG. 6, and FIG. 7, respectively.

Referring first to FIG. 5, a DC supply voltage $V_{SUPPLY}$ is applied to the emitter of a PNP bipolar transistor Q in common-emitter configuration. The DC supply voltage may be unregulated or, alternatively, may have been regulated/condition to an appropriate DC level for a desired instantaneous output power using, for example, a switching power supply in combination with a linear regulator as described in greater detail in the aforementioned patent applications. The collector of the transistor Q is connected through a resistive divider network R1, R2 to ground. An operational amplifier 501 is connected to receive a power-setting command signal 523 on a negative input and to receive on its positive input a voltage developed at the junction of the resistors R1 and R2. The operational amplifier 501 produces an output signal that is applied to the base of the transistor Q. In operation, the transistor functions as a controlled resistance, under control of the operational amplifier 501, to deliver a precisely-controlled voltage to multiple amplifier stages, including, for example, a driver stage 503 (responsive to an RF signal 509 analogous to signal 209 of FIG. 2) and a final stage 505; In the case of the driver stage 503, the controlled voltage from the transistor Q is applied through a resistor R3 to account for the sizing of the driver amplifier relative to the final amplifier. The foregoing circuit realizes fast control and may be used in conjunction with or in lieu of separate DC regulation circuitry.

One or more additional driver stages may be provided as shown, for example, in FIG. 6. In FIG. 6, the supply voltage of an initial stag 607 is controlled less stringently. A number of discrete supply voltages ($V_1$, $V_2$, ..., $V_N$) are applied to a switch 609, which is controlled to select a desired one of the discrete voltages. Control of the final stage 605 and the immediately preceding driver stage 603 may remain as previously described.

If a desired output signal has a large dynamic range, common control of the driver and final stages may prove insufficient. Referring to FIG. 7, separate control is provided for each of multiple amplifier stages. This arrangement may be extended to any arbitrary number of stages. Referring again to FIG. 2, in the case of constant amplitude output signals, the amplifier as shown is effective to provide efficient amplification and power control. However, it does not provide for amplitude modulation.

Figure 8:
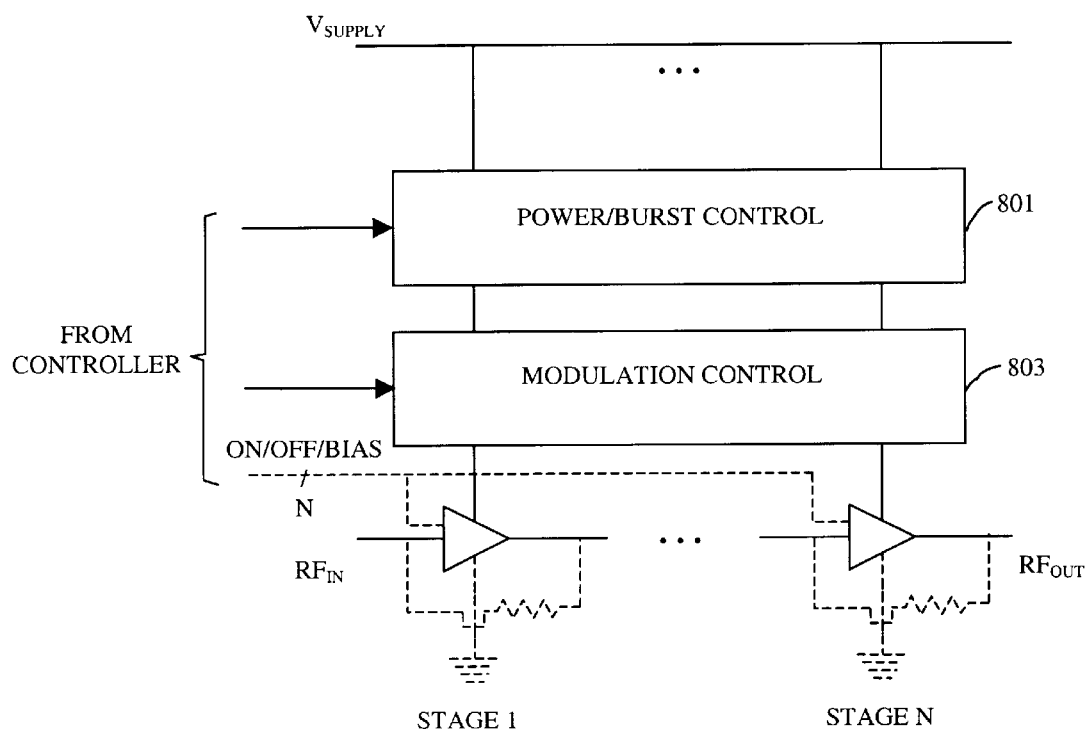
FIG. 8 is a block diagram of a generalized efficient power amplifier structure.

Referring now to FIG. 8, a generalized efficient power amplifier structure is shown, enabling control of multiple stages to achieve complex control, including amplitude modulation, of an amplifier output signal. In FIG. 8, an RF input signal, $RF_{in}$, is applied to an amplifier chain including N stages. The amplifier chain produces an RF output signal, $RF_{out}$. Supply voltages for each of the stages are independently controlled. One or more control blocks receive a DC supply voltage and, responsive to control signals from a controller (not shown), produce separate power supply voltages for each of the N amplifier stages. In the example of FIG. 8, two control blocks are shown, a power/burst control block 801 and a modulation control block 803. However, the functions of the control blocks may be readily consolidated or sub-divided as will be apparent to one of ordinary skill in the art.

Optionally, independent bias signals may be supplied to each one of the stages. In one embodiment, possible values of the bias signal include a value that turns the stage off, e.g., places the active element of the stage in a high-impedance state. In addition, each stage may optionally include a controlled bypass element or network, shown in FIG. 8 as a resistor connecting the input and output terminals of a stage. Such a bypass may allow performance of an amplifier stage at low input signal levels to be more completely characterized and controlled. In particular, since circuit parasitics unavoidably create the effect of a bypass, by explicitly providing a bypass, it may be designed in such a manner as to dominate parasitic effects.

A particular case of the generalized amplifier structure of FIG. 8 will now be described in detail.

Figure 9:
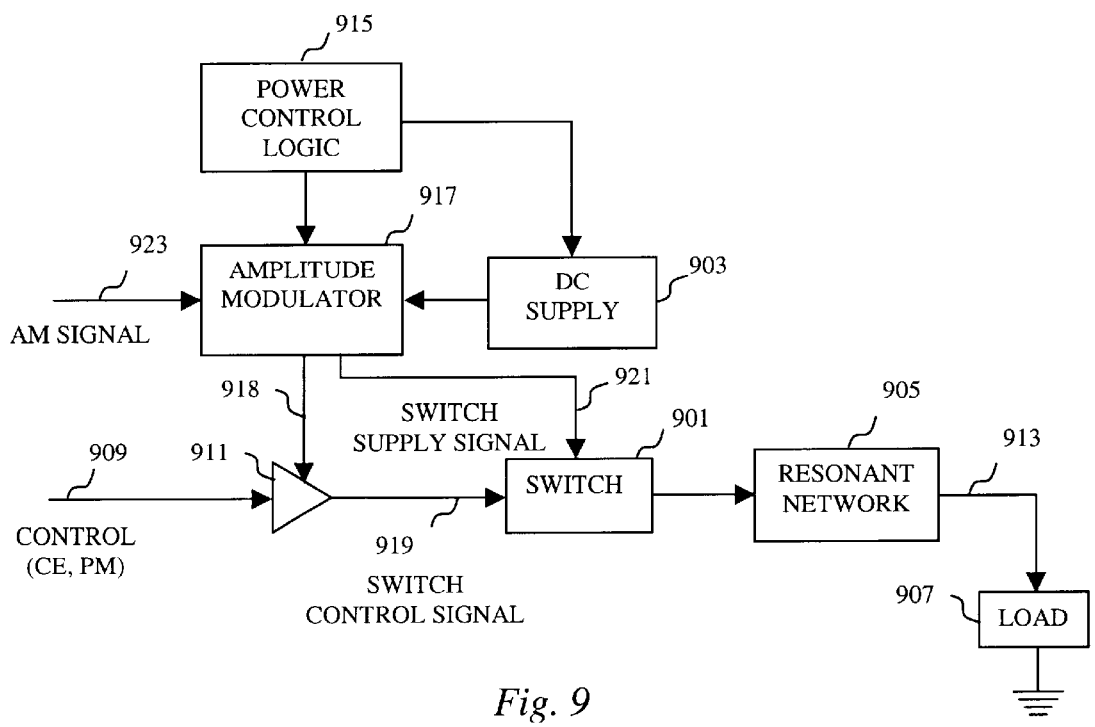
FIG. 9 is a block diagram of a switched-mode power amplifier having amplitude modulation capability.

Referring to FIG. 9, an amplifier is shown that provides the advantages of the amplifier of FIG. 2 and additionally provides for amplitude modulation. In FIG. 9, there is provided a switch 901, a DC supply 903, a resonant network 905, a load 907, a control signal 909, a control signal amplifier 911, an output signal 913 and power control logic 915, corresponding generally to and given like designations as elements in FIG. 2. The control signal amplifier 911 is responsive to a drive control signal 918 to produce a switch control signal 919 In FIG. 9, however, there is additionally provided an amplitude modulator 917 responsive to an AM signal 923. Instead of the power control logic 915 controlling the control signal amplifier 911 directly (as in FIG. 2), the power control logic 915 is coupled to the amplitude modulator 917, which is responsive to the power control logic 915 to control the control signal amplifier 911. Under the control of the amplitude modulator 917, the control signal amplifier 911 produces a switch control signal 919 that is applied to the switch 901. The DC supply 903 is coupled to the amplitude modulator 917, which is responsive to the AM signal 923 to modify the supply voltage appropriately and apply a resulting switch supply signal 921 to the switch 901.

Figure 10:
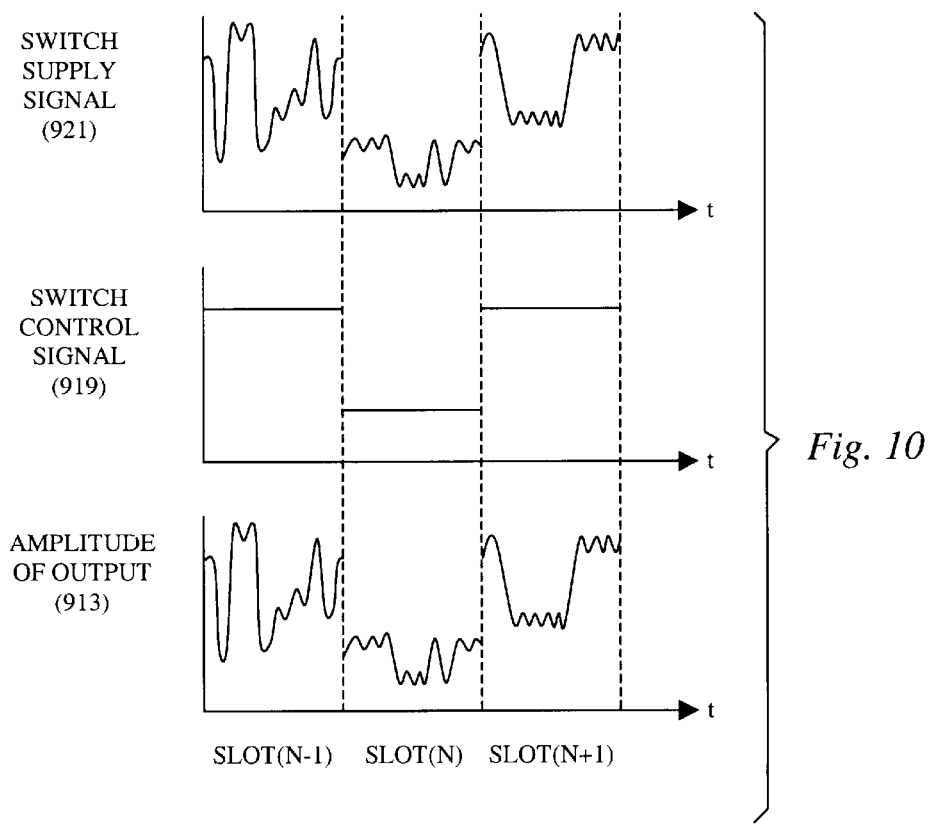
FIG. 10 is a waveform diagram of waveforms in the circuit of FIG. 9.

Two cases of operation of the amplifier of FIG. 9 may be distinguished. One case is shown in FIG. 10, in which amplitude modulation is achieved solely through variation of the switch supply signal 921, and power control is achieved jointly through variation of the DC supply 903 and variation of the switch control signal 919 (via signal 918). During a timeslot (N−1), the peak amplitude of the switch control signal 919 remains constant. During this time, the peak amplitude of the control signal 909 also remains constant. The switch supply signal 921, on the other hand, has impressed upon it amplitude modulation signal variations. As a result, the output signal 913 exhibits corresponding amplitude variations. During timeslot (N), the amplitudes of the control signal 909 and the switch control signal 919 are constant at a lower level, and a DC supply voltage 904 (not shown in FIG. 10) is also constant at a lower level, indicative of a lower desired output power level. Different amplitude modulation signal variations are impressed upon the switch supply signal 921 and are manifest in the amplitude of the output signal 913. During timeslot (N+1), the level of the control signal 909 and the switch control signal 919 are raised back up, as is the DC supply voltage 904, corresponding to a higher desired output power level. The constant peak amplitude of the switch control signal 919 is set higher for higher desired output power levels, and set lower for lower desired output power levels, so that the switch 901 is successfully turned on and off as needed while minimizing the undesirable leakage of the switch control signal 919 through the switch 901 and into the resonant network 905.

Figure 11:
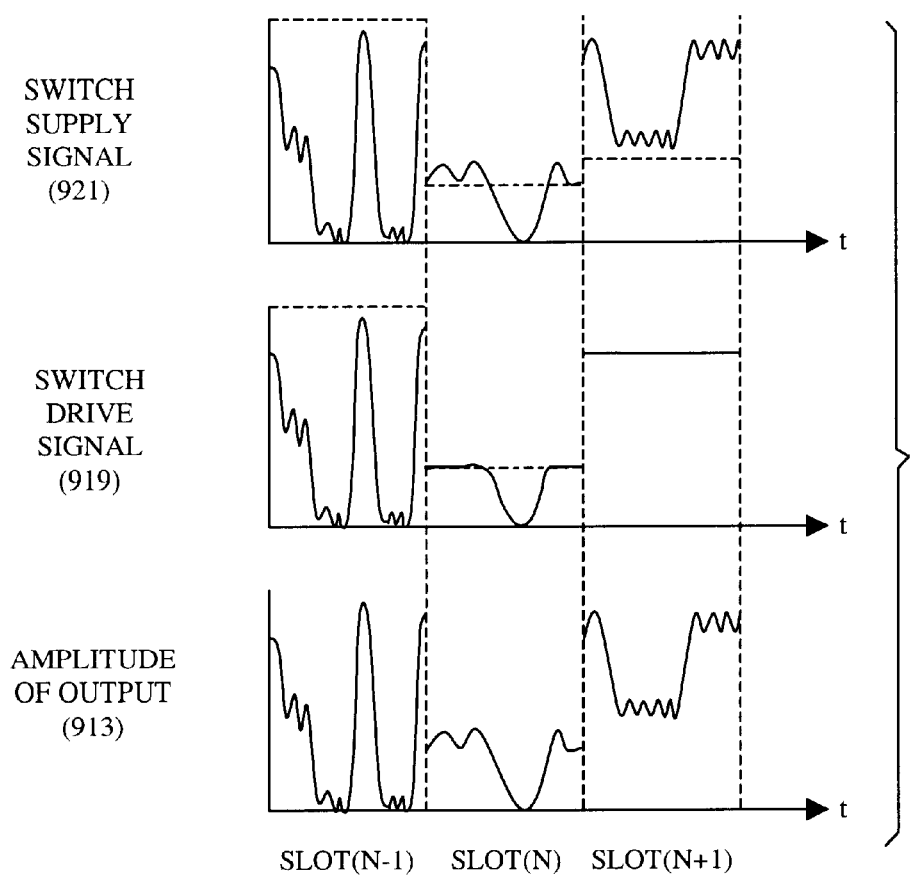
FIG. 11 is another waveform diagram of waveforms in the circuit of FIG. 9.

At lower power levels, to avoid excess leakage of the switch control signal 919 into the output signal 913, it may be necessary to achieve amplitude modulation of the output signal through coordinated variation of both the switch supply signal 921 and the switch control signal 919. This represents the second case of operation previously referred to, and is illustrated in FIG. 11. In particular, FIG. 11 shows examples of different relationships between amplitude modulation of the switch supply signal 921 and amplitude modulation of the switch control signal 919. Power control and amplitude modulation of both the switch supply signal 921 and the switch control signal 919 are applied as needed to extend the dynamic range of the output signal 913. In an exemplary embodiment, amplitude modulation of the switch control signal 919 is applied only when the AM signal 923 dips below a threshold that is power-level dependent.

Timeslot (N−1) illustrates the case in which the AM signal 923 is below the power-level-dependent threshold (indicated in dashed lines in the upper frame of the FIG. 11) for the duration of the timeslot. Hence, the switch control signal 919 is amplitude modulated along with the switch supply signal 921 throughout the duration of the timeslot. In timeslot (N), during both an initial portion of the timeslot and during a final portion of the timeslot, the AM signal 923 is assumed to be above the threshold. Hence, during these portions of the timeslot, the switch control signal 919 is not amplitude modulated. (In the middle frame of FIG. 11, the dashed lines indicate the nominal amplitude of the switch control signal 919 when the AM signal 923 is above the threshold.) During an intermediate portion of the timeslot, however, the AM signal 923 is assumed to be below the threshold. During this portion of the timeslot, the switch control signal 919 is amplitude modulated along with the switch supply signal 921. Finally, in timeslot (N+1), the AM signal 923 is assumed to be above the threshold throughout the duration of the timeslot. The amplitude (peak-to-peak) of the switch control signal 919 is therefore held constant throughout the duration of the timeslot. Note that the actual amplitude modulation is still solely impressed on the output signal 913 by switch supply signal 921. Variation of signal 918 and the resulting variation of signal 919 in concert with signal 921 is performed soley to reduce leakage. As such, the precision required of signal 918 is greatly reduced from that required of signal 921.

Figure 12:
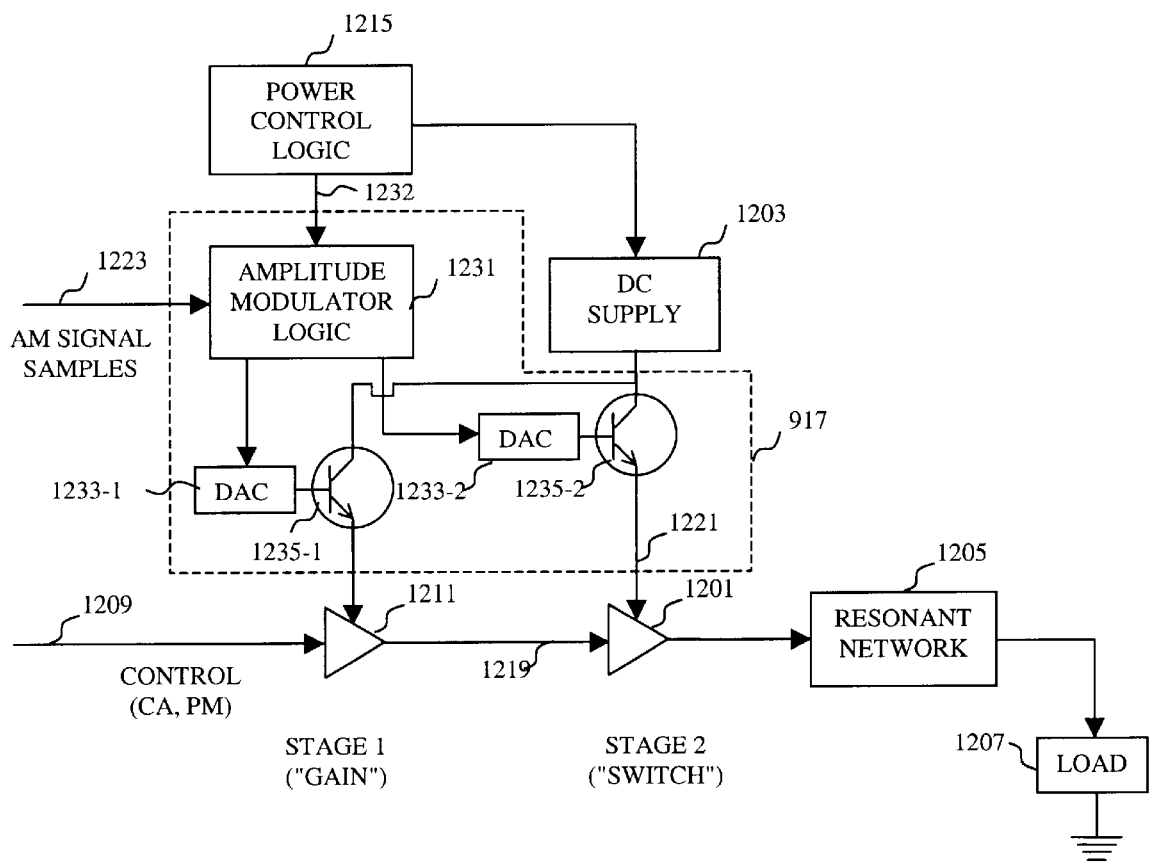
FIG. 12 is a more detailed diagram of an exemplary embodiment of the switched-mode power amplifier of FIG. 9.

Referring now to FIG. 12, a more detailed diagram is shown of an amplifier in accordance with an exemplary embodiment of the invention, in which like elements are assigned like reference numerals as in FIG. 9. In the embodiment of FIG. 12, the control signal amplifier 1211 and the switch 1201 are provided as first and second amplifier stages, a "gain" stage and a "switch" stage, respectively. The gain stage 211 may be implemented in a variety of ways. One implementation is a conventional gain-controlled linear CCS (controlled current source) amplifier of widely-understood classes A, AB, B and C. An alternative implementation is a smaller-scale switch-mode stage of a type described in the aforementioned copending U.S. applications.

Within dashed line block 917 are shown further details of one embodiment of the amplitude modulator 917 of FIG. 9. In response to AM signal samples 1223 and to a signal 1232 from the power control logic 1215, the AM logic 1231 calculates appropriate supply levels for the first amplifier stage 1211 and the second amplifier stage 1201.

In the case of the first amplifier stage 1211, a DC supply voltage is supplied through a transistor 1235-1. Base drive to the transistor 1235-1 is controlled by the AM logic 1231 through a DAC (digital to analog converter) 1233-1. Hence the DAC 1233-1 sets the level of the switch control signal 1219 seen by the second amplifier stage 1201. Similarly, in the case of the second amplifier stage 1201, a DC supply voltage is supplied through a transistor 1235-2. Base drive to the transistor 1235-2 is controlled by the AM logic 1231 through a DAC 1233-2.

In an exemplary embodiment, the output of the DAC 1233-1 is given by the following rule:

$$DAC_1(t) = v(p), \quad \text{for } a(t) \geq m(p)$$
$$= v(p) \cdot \frac{a(t)}{m(p)}, \quad \text{for } a(t) < m(p)$$

where a(t) is the AM signal at time t, m(p) is a threshold dependent on the power level p, and v(p) is the nominal output voltage of $DAC_1$, for power level p.

Figure 13:
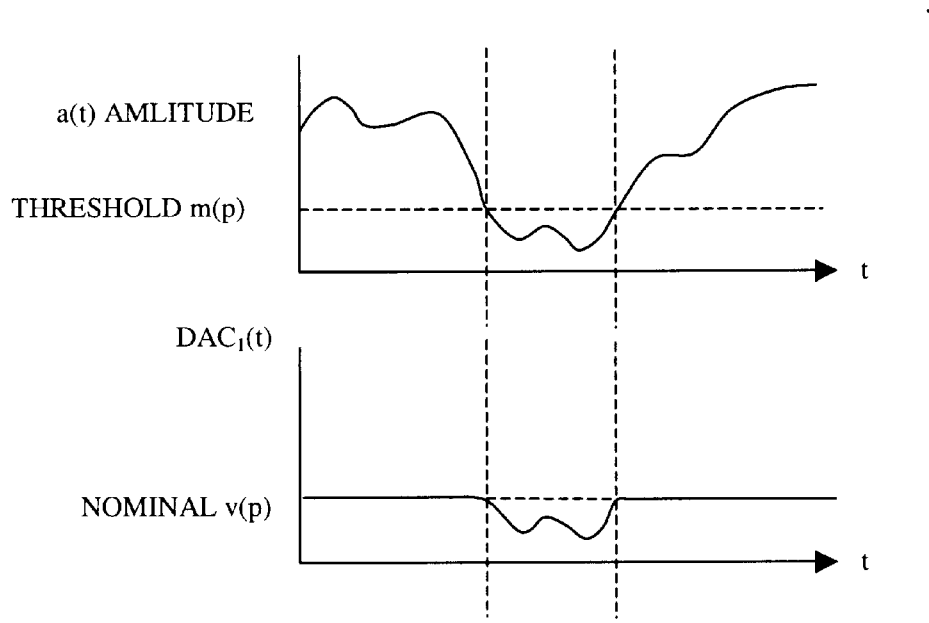
FIG. 13 is a waveform diagram of waveforms in the circuit of FIG. 12.

Operation of the amplifier of FIG. 12 in accordance with the foregoing rule is illustrated in FIG. 13. As seen therein, as the signal a(t) (the amplitude of the AM signal at time t) fluctuates, for a first period of time, the signal exceeds the threshold m(p) for the current power level p. During this period, the voltage $DAC_1(t)$ is set to the nominal level v(p). Thereafter, the signal a(t) dips below the threshold for a period of time. During this period of time, the voltage $DAC_1(t)$ is amplitude modulated in accordance with the fluctuations of the signal a(t). When the signal a(t) again rises above the threshold, the voltage $DAC_1(t)$ is again set to the nominal level.

Thus, there has been described an efficient amplifier for RF signals that provides for amplitude modulation over a wide dynamic range. The amplitude of the switch control signal is adjusted to reduce the undesirable leakage effect. As a result, it becomes possible to produce output signals having average power anywhere within a wide range, or to greatly increase the dynamic range over which amplitude modulation may be produced at a given average power level, or both.

It will be apparent to those of ordinary skill in the art that the present invention can be embodied in other specific forms without departing from the spirit or essential character thereof. The described embodiments are therefore intended to be in all respects illustrative and not restrictive. The scope of the invention is indicated by the appended claims, rather than the foregoing description, and all changes which come within the meaning and range of equivalents thereof are intended to be embraced therein.

What is claimed is:

1. A method of generating a variable output signal using an amplifier device including a final amplification stage having at least three ports including an input port, an output port, and a power supply port, the method comprising:
    varying a signal applied to the power supply port of the amplifier device in order to control at least one of a power output and a modulation characteristic of an output signal of the amplifier device produced at the output port thereof; and
    selectively varying in amplitude an input signal applied to the input port of the amplifier device in accordance with a desired characteristic of the output signal of the amplifier device, comprising:
        comparing a desired amplitude of the output signal of the final amplification stage with a threshold value; and
        when the desired amplitude is less than the threshold value, reducing the amplitude of the input signal;
    wherein the final amplification stage has a drive signal causing the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal.

2. The method of claim 1, wherein the threshold is a variable threshold.

3. The method of claim 2, wherein the threshold is dependent on a desired average out-put power.

4. The method of claim 1, wherein reducing the amplitude of the input signal comprises scaling down the input signal in accordance with a ratio of the desired amplitude of the output signal and the threshold.

5. The method of claim 1, further comprising, when the desired amplitude is more than the threshold value, setting the amplitude of the input signal to a predetermined value.

6. The method of claim 5, wherein the predetermined value is dependent on a desired average output power.

7. The method of claim 1, wherein the input signal applied to the final amplification stage is produced as an output signal of a further amplification stage having at least three ports including an input port, an output port, and a power control port.

8. The method of claim 7, wherein selectively varying comprises varying a signal applied to a power control port of the further amplification stage.

9. The method of claim 8, wherein selectively varying comprises varying a signal applied to a power control port of the further amplification stage., wherein an input signal of the further amplification stage is phase-modulated.

10. An amplifier apparatus, comprising:
at least a final amplification stage having at least three ports including an input port, an output port, and a power supply port; and
control circuitry for:
varying a signal applied to the power supply port of the final amplification stage in order to control at least one of a power output and a modulation characteristic of a variable output signal of the final amplification stage produced at the output port thereof; and
selectively varying in amplitude an input signal applied to the input port of the final amplification stage in accordance with a desired characteristic of the output signal of the final amplification stage;
wherein the control circuitry comprises at least a further amplification stage having at least three ports including an input port, an output port, and a power supply port, an input signal of the further amplifier stage being phase-modulated;
wherein the final amplification stage has a drive signal causing the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal.

11. The power modulator of claim 10, wherein the control circuitry comprises a variable power supply.

12. The power modulator of claim 11, wherein the variable power supply produces power on one or more power conductors, the one or more power conductors being coupled to the power input ports of the final amplifier stage and the further amplifier stage.

13. The power modulator of claim 12, comprising power control logic responsive to a power control signal for controlling a power level of the variable power supply.

14. The power modulator of claim 12, wherein the one or more power conductors are coupled to the power input ports of the final amplification stage and the further amplification stage through first and second active circuitry, respectively.

15. The power modulator of claim 14, comprising modulation control logic responsive to modulation information for controlling the first and second active circuitry.

16. The power modulator of claim 15, wherein the modulation control logic is responsive to a signal from the power control logic.

17. The power modulator of claim 15, wherein the modulation control logic comprises software code executed on a processor, further comprising interface circuitry coupled between the processor and the first and second active circuitry.

18. The power modulator of claim 17, wherein the interface circuitry comprises at least one digital to analog converter.

19. An amplifier apparatus, comprising:
at least a final amplification stage having at least three ports including an input port, an output port, and a power supply port;
means for varying a signal applied to the power supply port of the final amplification stage in order to control at least one of a power output and a modulation characteristic of a variable output signal of the final amplification stage produced at the output port thereof; and
means for selectively varying in amplitude an input signal applied to the input port of the final amplification stage in accordance with a desired characteristic of the output signal of the final amplification stage, including comparing a desired amplitude of the output signal of the final amplification stage with a threshold value, and when the desired amplitude is less than the threshold value, reducing the amplitude of the input signal;
wherein the final amplification stage has a drive signal causing the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal.

20. A variable output signal RF power modulator comprising:
control means responsive to multiple different control signals for producing from a supply voltage multiple voltages within a range of voltages; and
multiple power amplification stages, including a final amplification stage, each having one of said multiple voltages as a supply voltage;
wherein the final amplification stage has a drive signal causing the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal, and wherein the control means performs more than one of power control, burst control, and modulation.

21. The power modulator of claim 20, wherein the control means performs power control, burst control, and modulation.

22. The power modulator of claim 20, further comprising multiple bias control signals, wherein each of multiple power amplification stages is responsive to one of said bias control signals.

23. The power modulator of claim 20, wherein at least some of said bias control signals have a condition that causes a responsive power amplification stage to be turned off.

24. The power modulator of claim 20, wherein at least some of said multiple power amplification stages are provided with bypass elements or networks coupling stage input to stage output, said bypass elements or networks dominating parasitic bypass effects.

* * * * *

UNITED STATES PATENT AND TRADEMARK OFFICE
CERTIFICATE OF CORRECTION

PATENT NO. : 6,734,724 B1
DATED : May 11, 2004
INVENTOR(S) : Stephan V. Schell et al.

It is certified that error appears in the above-identified patent and that said Letters Patent is hereby corrected as shown below:

Column 4,
Line 14, replace "application" with -- applications --.
Line 17, replace "data" with -- date --.

Column 5,
Line 7, replace "conditione" with -- conditioned --.

Column 6,
Line 20, replace "919" with -- 919. --.

Signed and Sealed this

Twenty-sixth Day of October, 2004

JON W. DUDAS
*Director of the United States Patent and Trademark Office*